US008890496B2

(12) United States Patent
Inoue et al.

(10) Patent No.: US 8,890,496 B2
(45) Date of Patent: Nov. 18, 2014

(54) DRIVE CONTROLLER

(75) Inventors: Takeshi Inoue, Nagoya (JP); Masakiyo Sumitomo, Okazaki (JP)

(73) Assignee: DENSO CORPORATION, Kariya (JP)

( * ) Notice: Subject to any disclaimer, the term of this patent is extended or adjusted under 35 U.S.C. 154(b) by 44 days.

(21) Appl. No.: 13/191,765

(22) Filed: Jul. 27, 2011

(65) Prior Publication Data
US 2012/0025794 A1    Feb. 2, 2012

(30) Foreign Application Priority Data

| Jul. 29, 2010 | (JP) | 2010-170416 |
| Jun. 2, 2011 | (JP) | 2011-124196 |

(51) Int. Cl.
*G05F 1/00* (2006.01)
*H02M 3/158* (2006.01)
*H02M 3/155* (2006.01)

(52) U.S. Cl.
CPC ...... *H02M 3/158* (2013.01); *H02M 2003/1555* (2013.01)
USPC .......................................... 323/271; 323/282

(58) Field of Classification Search
CPC ................ H02M 3/156; H02M 3/158; H02M 2003/1555; G05F 1/46; G05F 1/56; G05F 1/569; G05F 1/571; G05F 1/573; G05F 1/5735; G05F 1/59; G05F 1/595; G05F 1/613; G05F 1/618
USPC ......... 323/234, 265, 269–275, 281, 282–285, 323/351, 222–226; 363/15, 34, 363/56.01–56.04, 131, 132
See application file for complete search history.

(56) References Cited

U.S. PATENT DOCUMENTS

| 3,766,468 | A | * | 10/1973 | Cardwell, Jr. ................. 363/136 |
| 5,619,047 | A | | 4/1997 | Bauer |
| 6,058,037 | A | | 5/2000 | Shibata et al. |
| 6,396,250 | B1 | * | 5/2002 | Bridge .......................... 323/283 |
| 7,446,513 | B2 | * | 11/2008 | Dikken et al. ................. 323/271 |
| 7,508,174 | B2 | * | 3/2009 | Wei et al. ...................... 323/223 |
| 7,778,054 | B2 | | 8/2010 | Sasaya et al. |
| 2004/0089910 | A1 | | 5/2004 | Hirler et al. |
| 2007/0230224 | A1 | * | 10/2007 | Yamada et al. ................. 363/49 |
| 2008/0265975 | A1 | | 10/2008 | Takasu et al. |

(Continued)

OTHER PUBLICATIONS

Examination Report mailed on Jan. 22, 2013 in the corresponding JP application No. 2011-124196.

(Continued)

*Primary Examiner* — Timothy J Dole
*Assistant Examiner* — Carlos Rivera-Perez
(74) *Attorney, Agent, or Firm* — Posz Law Group, PLC

(57) ABSTRACT

A drive controller for driving an inductive load connected to a node between first and second switches connected in series with a direct current voltage source includes a first diode, a series circuit of a second diode and an inductor, and a control circuit. The first diode is a parasitic diode of the first switch and connected in antiparallel with the first switch. The series circuit is connected in parallel with the first diode. The control circuit drives the inductor load by applying a control voltage to the first switch before applying a first ON-voltage to the second switch. The first ON-voltage turns ON the second switch. The control voltage is greater than zero and less than a second ON-voltage. The second ON-voltage turns ON the first switch. The control voltage causes the first switch to operate in weak inversion.

25 Claims, 17 Drawing Sheets

(56) References Cited

U.S. PATENT DOCUMENTS

| | | | |
|---|---|---|---|
| 2008/0291702 A1* | 11/2008 | Hosotani | 363/21.02 |
| 2009/0206812 A1 | 8/2009 | Sasaya et al. | |
| 2010/0283514 A1 | 11/2010 | Soeno et al. | |
| 2011/0018512 A1 | 1/2011 | Horii | |

OTHER PUBLICATIONS

Office action mailed Jan. 7, 2014 in the corresponding JP application No. 2013-59960, which is the divisional application of JP 2011-124196 (and English translation).

* cited by examiner

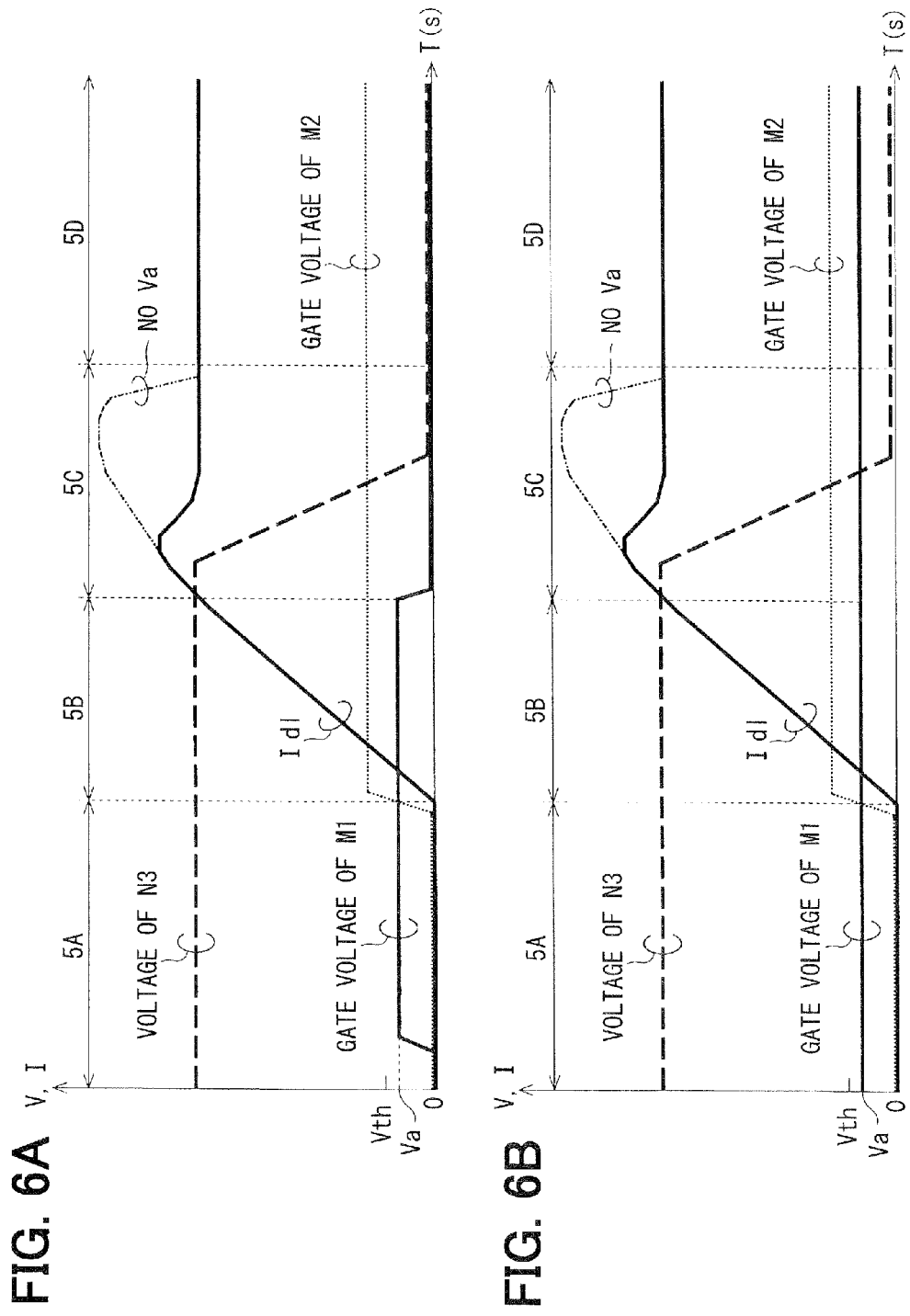

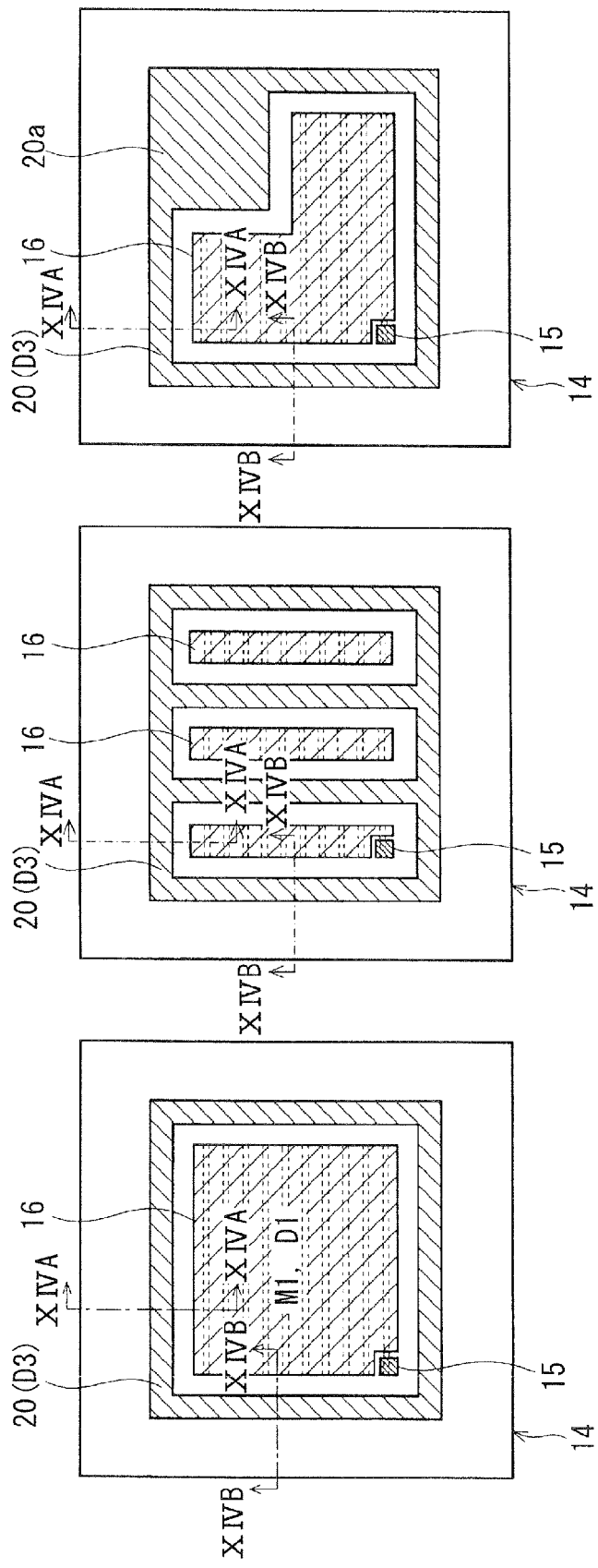

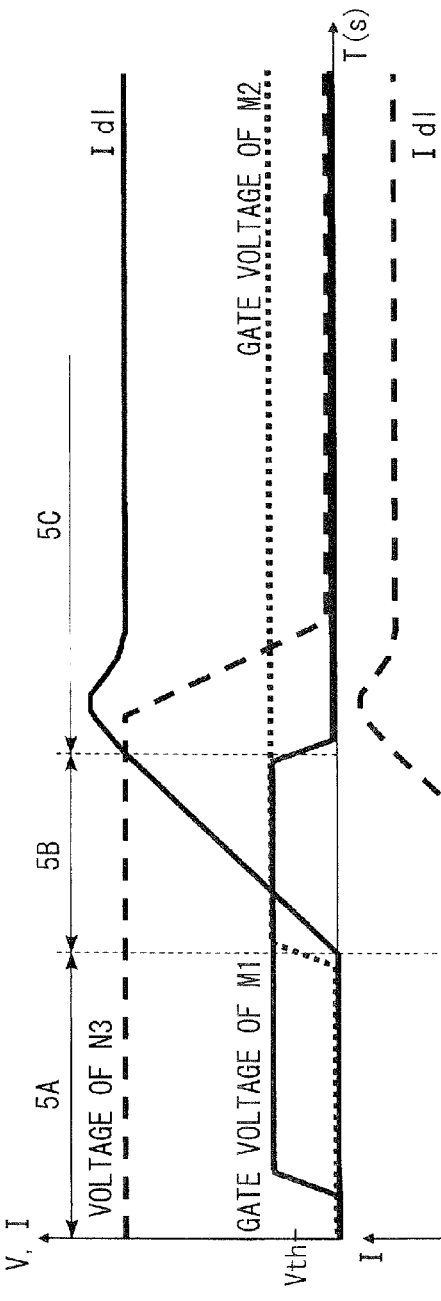
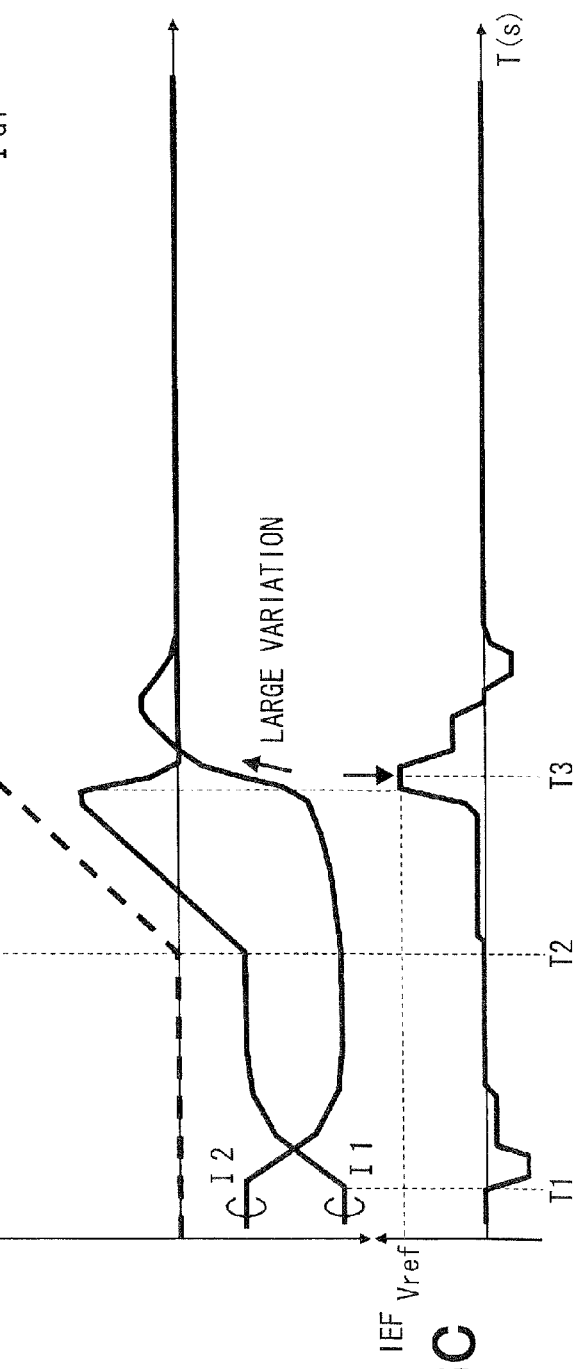
FIG. 16A
FIG. 16B
FIG. 16C

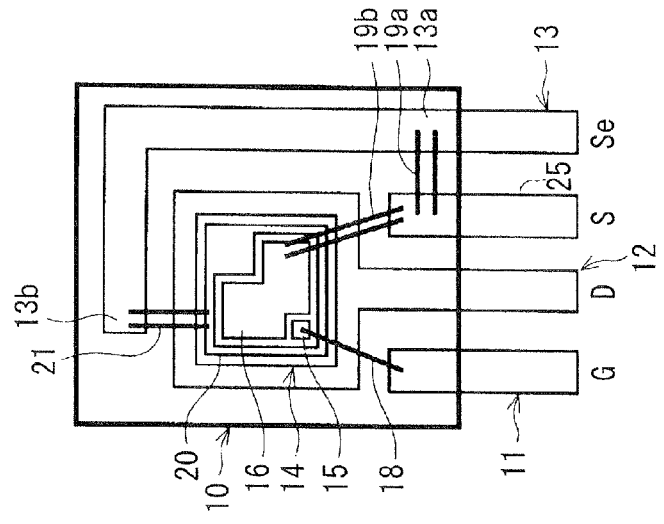
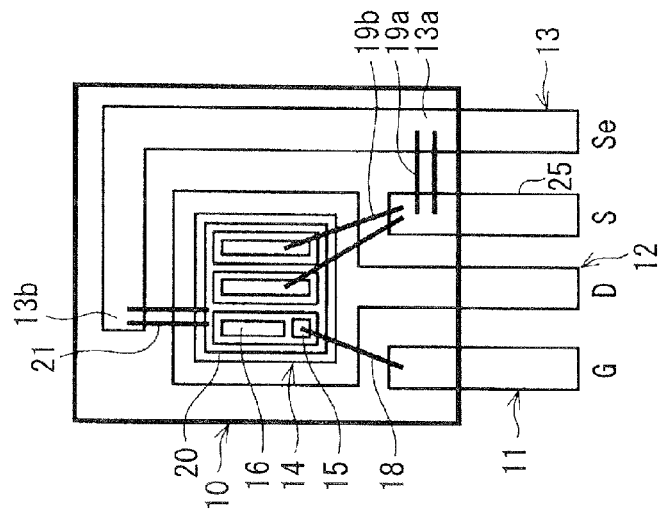
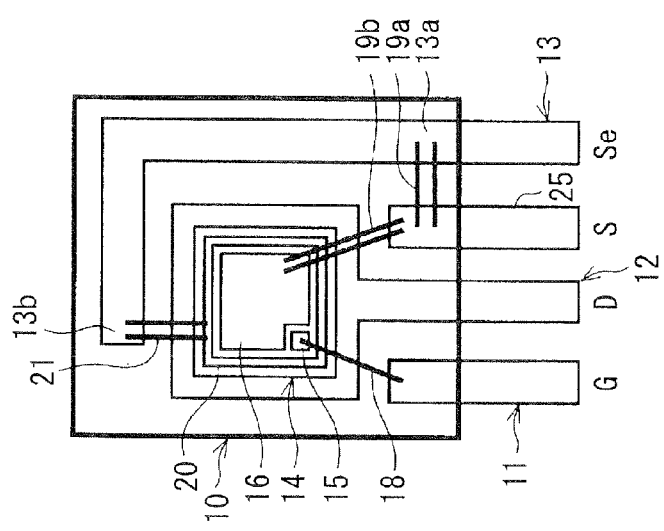

US 8,890,496 B2

DRIVE CONTROLLER

CROSS REFERENCE TO RELATED APPLICATION

This application is based on and claims priority to Japanese Patent Application No. 2010-170416 filed on Jul. 29, 2010 and No. 2011-124196 filed on Jun. 2, 2011, the contents of which are incorporated herein by reference.

FIELD OF THE INVENTION

The present invention relates to a drive controller for controlling a switching device that has an antiparallel diode and forms a bridge circuit for driving a load.

BACKGROUND OF THE INVENTION

For example, a half-bridge circuit, a full-bridge circuit, and a three phase bridge circuit have been known as a bridge circuit for driving a load. In U.S. Pat. No. 5,619,047 corresponding to JP-A-8-213639, only the inductance is connected to the anode of the diode that is connected in antiparallel with the IGBT.

Thus, the induced voltage in the inductance changes in proportion to the change dI/dt in the current flowing through the diode. The polarity of the induced voltage is negative until the diode current reaches the reverse current peak. Then, when the current direction changes, the polarity of the induced voltage changes so that the positive voltage can be applied to the control electrode of the diode. U.S. Pat. No. 5,619,047 further discloses that the bonding wire connecting the electrode of the diode to the lead of the module can provide the necessary inductance.

In US 2008/0265975 corresponding to JP-A-2008-278552, the external diode is connected in antiparallel with the vertical MOSFET having the body diode. The gate voltages of the Hi-MOSFET and the Lo-MOSFET are switched between the voltages Von (>0), Voff1 (=0), and Voff2 (<0).

In the second OFF condition, the voltage Voff2 is applied to the gates of the Hi-MOSFET and the Lo-MOSFET so that the forward voltage of the body diode can become Vf2. Thus, the current is less likely to flow to the body diode. As a result, the current flowing to the external diode is increased, and the reverse recovery characteristics are improved. Further, the second OFF condition prevents the gate voltage from instantaneously exceeding the threshold voltage at the time of the switching operation.

It may be difficult to obtain desired reverse recovery characteristics before and after turn-ON of a switching device by combining the techniques disclosed in U.S. Pat. No. 5,619,047 and US 2008/0265975.

SUMMARY OF THE INVENTION

In view of the above, it is an object of the present invention to provide a drive controller for obtaining desired reverse recovery characteristics before and after turn-ON of a switching device.

According to an aspect of the present invention, a drive controller for driving an inductive load connected to a node between a first switching device and a second switching device that are connected in series with a direct current voltage source includes a first diode, a series circuit of a second diode and an inductor, and a control circuit. The first diode is connected in antiparallel with the first switching device and a parasitic diode of the first switching device. The series circuit is connected in parallel with the first diode. The control circuit drives the inductor load by applying a control voltage to a control terminal of the first switching device before applying a first ON-voltage to a control terminal of the second switching device. The first ON-voltage turns ON the second switching device. The control voltage is greater than zero and less than a second ON-voltage. The second ON-voltage turns ON the first switching device. The control voltage causes the first switching device to operate in weak inversion.

BRIEF DESCRIPTION OF THE DRAWINGS

The above and other objects, features, and advantages will become more apparent from the following description and drawings in which like reference numerals depict like elements. In the drawings:

FIGS. 6A and 6B are diagrams illustrating time changes in voltage and current observed in periods of FIGS. 5A-5D;

FIGS. 13A-13C are diagrams illustrating a top view of a semiconductor chip in the package;

FIG. 16A is a diagram corresponding to FIG. 10 and illustrating time changes in voltage and current observed in the drive controller according to the second embodiment, FIG. 16B illustrates time response of energization currents of diodes in the drive controller according to the second embodiment, and FIG. 16C illustrates a time response of an induced electromotive force generated in an inductor in the drive controller according to the second embodiment;

FIGS. 18A-18C are diagrams illustrating a top view of a package for the drive controller according to the second embodiment and the modification of the second embodiment.

DETAILED DESCRIPTION OF THE PREFERRED EMBODIMENTS

First Embodiment

Figure 1:
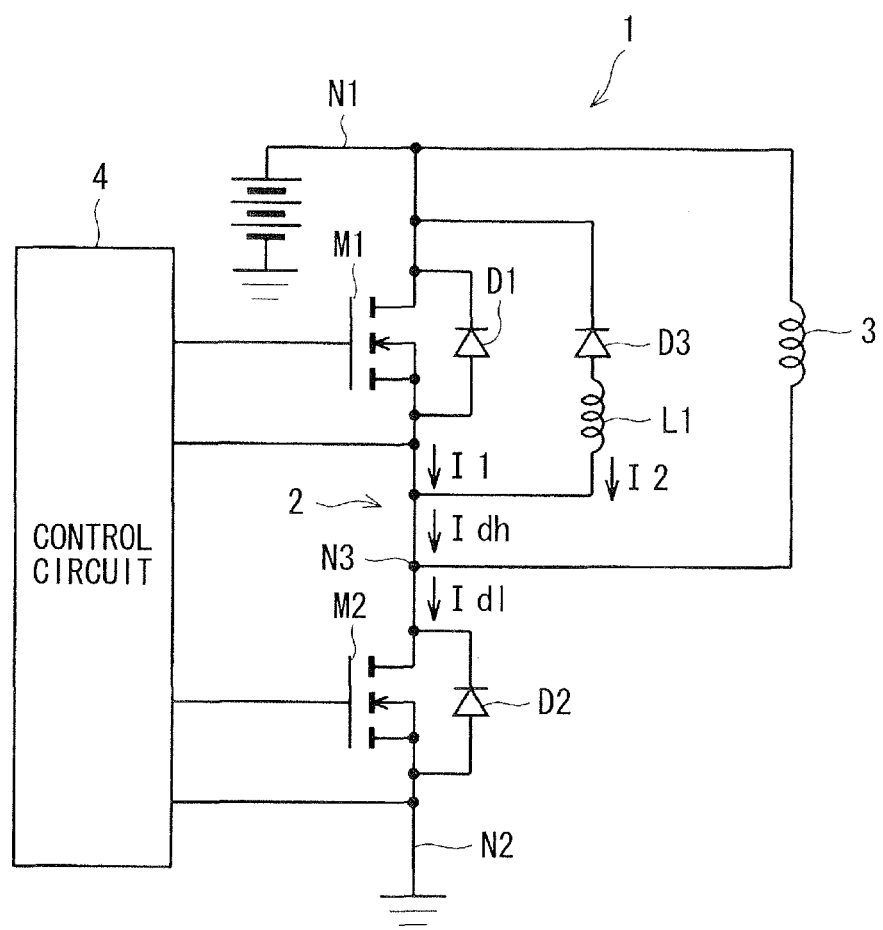
FIG. 1 is a circuit diagram of a drive controller according to a first embodiment of the present invention.

A drive controller 1 according to a first embodiment of the present invention is described below with reference to FIGS. 1-11B. As shown in FIG. 1, the drive controller 1 includes a high-side N-channel MOSFET M1 and a low-side N-channel MOSFET M2. The MOSFET M1 and the MOSFET M2 are connected in series to form a half-bridge circuit 2 between positive and negative terminals N1 and N2 of a direct-current (DC) power source. The half-bridge circuit 2 drives an inductive load 3 that is connected to a node N3 between the MOSFET M1 and the MOSFET M2.

The drive controller 1 further includes a control circuit 4. The control circuit 4 drives the gates (i.e., control terminals) of the MOSFETs M1 and M2. The MOSFET M1 has an intrinsic antiparallel body diode (i.e., parasitic diode) D1 that is connected between the drain and the source to conduct a circulating current.

Likewise, the MOSFET M2 has an intrinsic antiparallel body diode (i.e., parasitic diode) D2 that is connected between the drain and the source to conduct a circulating current.

The drive controller 1 further includes an external diode D3 that is connected in antiparallel with the MOSFET M1. The external diode D3 and an inductor L1 (i.e., inductance component) are connected in series between the drain and the source of the MOSFET M1. For example, the inductor L1 can be a bonding wire connected between the source of the MOSFET M1 and the anode of the external diode D3. For example, the bonding wire can have an inductance of 10 nanohenry (nH).

Figure 2:
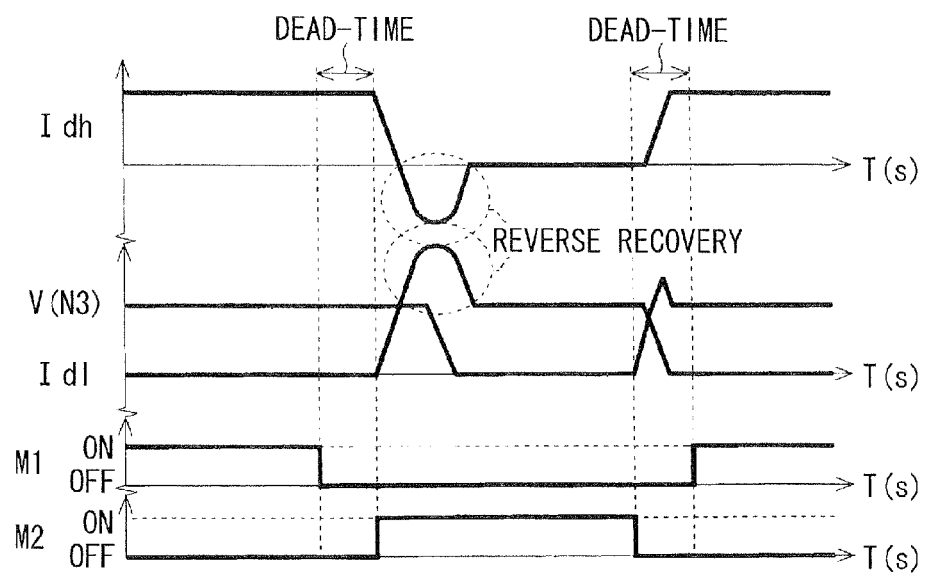
FIG. 2 is a timing chart illustrating a basic operation of the drive controller.

Next, basic operations of the drive controller 1 are described below with reference to FIG. 2. As shown in FIG. 2, the MOSFETs M1 and M2 are turned ON and OFF in a complementary manner in response to control signals from the control circuit 4. Thus, for example, a DC voltage can be converted into an AC voltage, or a voltage can be stepped up/down.

If the MOSFETs M1 and M2 are turned ON at the same time, the power source can be short-circuited. To prevent the short-circuit, as shown in FIG. 2, there is a dead-time during which both the MOSFETs M1 and M2 are OFF. During the dead-time, a load current flows to the body diode D1 of the MOSFET M1. Then, when the MOSFET M2 is turned ON, the load current flows to the MOSFET M2.

In this case, due to poor reverse recovery characteristics of the body diode D1, a large amount of a reverse recovery current flows though the body diode D1. As a result, a turn-ON switching loss of the MOSFET M2 and diode D1 is increased, and noise occurs. To prevent such problems, according to the first embodiment, as shown in FIG. 1, the half-bridge circuit 2 has two current paths. The first current path is formed with the body diode D1 that is connected in antiparallel with the MOSFET M1. The second path is formed with a series circuit of the inductor L1 and the external diode D3. The series circuit of the inductor L1 and the external diode D3 is connected in parallel with the body diode D1.

Figure 3:
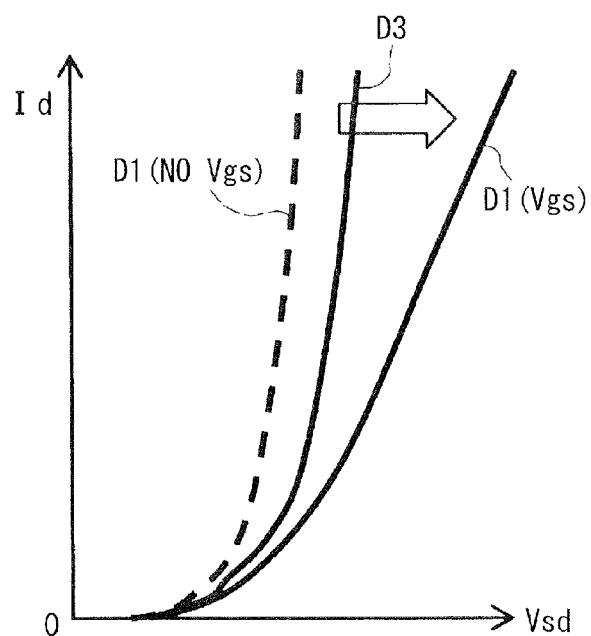
FIG. 3 is a diagram illustrating voltage-current characteristics of diodes used in the drive controller.
Figure 4:
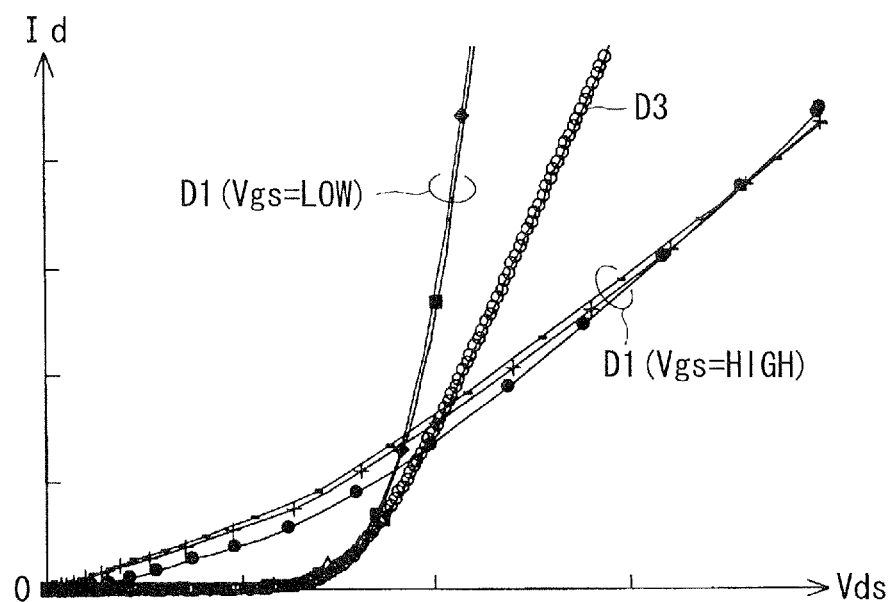
FIG. 4 is a diagram a result of a simulation conducted to evaluate the voltage-current characteristics of the diodes.

FIG. 3 illustrates voltage-current characteristics of the body diode D1 and the external diode D3. FIG. 4 illustrates a result of a simulation conducted by the present inventors. As can be seen from FIGS. 3 and 4, a forward voltage Vf of the body diode D1 is relatively low, and a forward voltage Vf of the external diode D3 is greater than that of the body diode D1. The forward voltage Vf of the body diode D1 can be increased above the forward voltage Vf of the external diode D3 by applying a predetermined positive voltage Vgs to the gate of the MOSFET M1.

In general, as shown in FIG. 2, the dead-time is provided before the MOSFET M2 is turned ON. In contrast, according to the first embodiment, the control circuit 4 applies a control voltage Va to the gate of the MOSFET M1 before the MOSFET M2 is turned ON, thereby reducing the reverse recovery current of the body diode D1. The control voltage Va is greater than zero and less than a threshold voltage Vth of the MOSFET M1. The threshold voltage Vth of the MOSFET M1 is hereinafter sometimes called the "second ON-voltage". FIGS. 5A-5D illustrate an energization condition before and after turn-ON of the MOSFET M2. The control circuit 4 applies the control voltage Va to the gate of the MOSFET M1 during the general dead time before the turn-ON of the MOSFET M2. As mentioned above, the control voltage Va has a positive value less than the threshold voltage Vth of the MOSFET M1. It is noted that "ON(Va)" in FIGS. 5A-5D means that the control voltage Va is applied to the gate of the MOSFET M1. Preferably, the control voltage Va should have a margin that can prevent the control voltage Va from exceeding the threshold voltage Vth of the MOSFET M1 when noise is superimposed on the control voltage Va. In such an approach, it is ensured that a self turn-ON of the MOSFET M1 due to noise is prevented.

Figure 5A:
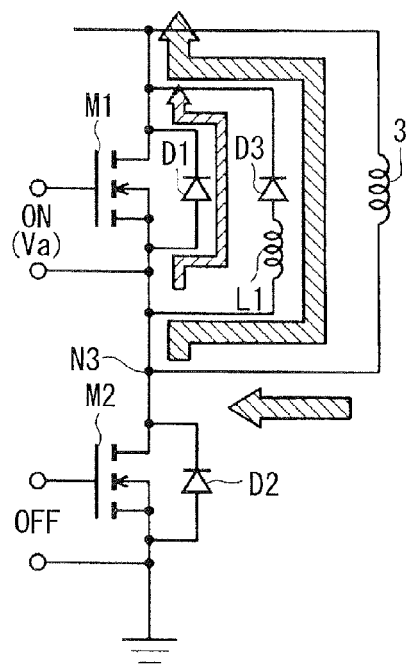
FIGS. 5A-5D are diagrams illustrating an energization condition in the drive controller before and after turn-ON of one switching device.

As shown in FIG. 5A, during a time period when the control circuit 4 applies the control voltage Va to the MOSFET M1, an electric current caused by magnetic energy stored in the inductive load 3 circulates through the body diode D1 and the external diode D3. Energy caused by the circulating current is stored as magnetic energy in the inductor L1 that is connected in series with the external diode D3.

Figure 5B:
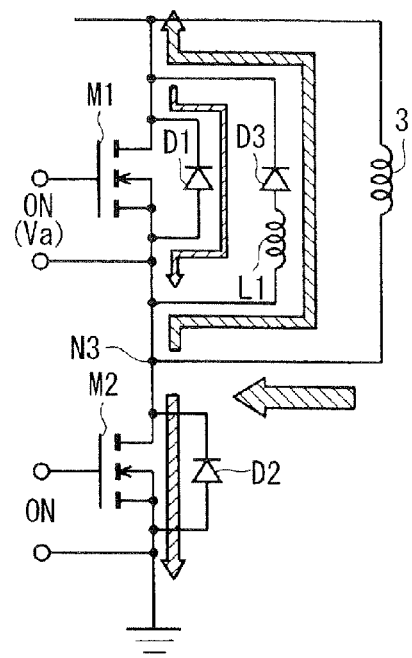

Then, as shown in FIG. 5B, the control circuit 4 applies a voltage equal to or greater than a threshold voltage Vth of the MOSFET M2 to the gate of the MOSFET M2. The threshold voltage Vth of the MOSFET M2 is hereinafter sometimes called the "first ON-voltage". When the first ON-voltage or more is applied to the gate of the MOSFET M2, the MOSFET M2 is turned ON. As a result, a transient current flows between the drain and the source of the MOSFET M2. Thus, a potential at the node N3 between the MOSFETs M1 and M2 decreases so that the body diode D1 and the external diode D3 can be reverse-biased.

The external diode D3 is connected in series with the inductor L1. Therefore, the current flowing through the second current path, which is formed with the inductor L1 and the external diode D3, is time-delayed relative to the current flowing through the first current path, which is formed with the body diode D1. In this case, as shown in FIG. 5B, a reverse recovery current of the body diode D1 flows to the external diode D3 due to the energy stored in the inductor L1. The current flowing through the second current path continues with a delay from the current flowing through the first current path.

Figure 5C:
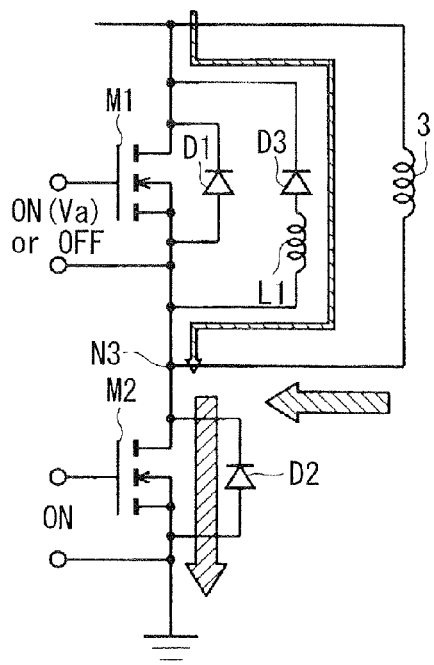
Figure 5D:
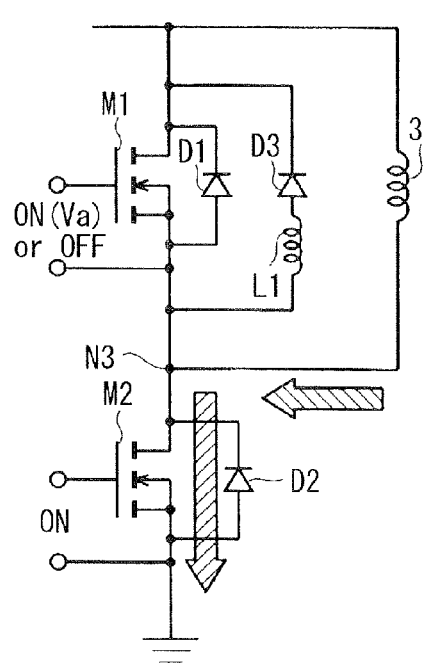

Then, as shown in FIG. 5C, when a reverse recovery period of the body diode D1 is elapsed, the reverse recover current does not flow through the body diode D1. At this time, since the MOSFET M2 remains ON, the reverse recovery current flows to the second current path with a delay from a reverse recovery action of the external diode D3. Then, as shown in FIG. 5D, the load current flows to the MOSFET M2.

In the example shown in FIGS. 5A-5D, the control circuit 4 applies the control voltage Va, which is less than the threshold voltage Vth of the MOSFET M1, to the gate of the MOSFET M1 before turning ON the MOSFET M2. Here, it is assumed that the control circuit 4 applies the first ON-voltage or more to the gate of the MOSFET M2 to turn ON the MOSFET M2 while keeping the gate voltage of the MOSFET M1 at the turn-OFF voltage (e.g., 0 volts).

The number of minority carriers remaining in the body diode D1 at the time of turn-ON of the MOSFET M2 is larger when the gate voltage of the MOSFET M1 is kept at the turn-OFF voltage (e.g., 0 volts) than when the gate voltage of the MOSFET M1 is kept at the control voltage Va. Therefore, when the current flowing between the drain and the source of the MOSFET M2 is increased transiently, the reverse recovery current flowing to the body diode D1 is increased. As a result, a current I1 flowing in a reverse direction of the body diode D1 is increased. Therefore, it takes much time for the body diode D1 to perform the reverse recovery action, and the switching loss and the noise are increased.

Figure 7:
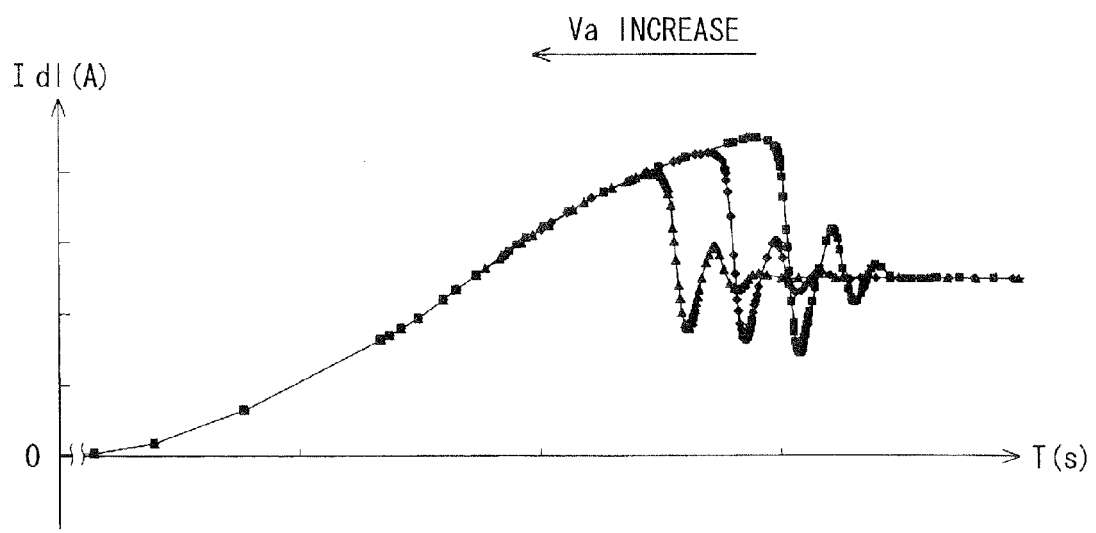
FIG. 7 is a diagram illustrates a result of a simulation conducted to evaluate a characteristic of a current in the drive controller.

FIG. 6A illustrates voltage-current characteristics observed in periods of FIGS. 5A-5D. In FIG. 6A, a characteristic of a current Idl is compared between when the control voltage Va is applied to the gate of the MOSFET M1 and when the control voltage Va is not applied to the gate of the MOSFET M1 during the periods of FIGS. 5A and 5B. FIG. 7 illustrates the characteristic of the current Idl observed by changing the control voltage Va as a parameter. It is noted that (5A), (5B), (5C), and (5D) in FIG. 6A represents the periods of FIGS. 5A, 5B, 5C, and 5D, respectively.

In the period (5A) in FIG. 6A, as shown in FIG. 5A, the control circuit 4 applies the control voltage Va to the gate of the MOSFET M1 at the time the load current circulates through the body diode D1, the external diode D3, and the inductor L1. Thus, charges are injected into the gate of the MOSFET M1. In this case, the MOSFET M1 operates in weak inversion so that the drain current can be increased exponentially. As shown in the period (5B) in FIG. 6A, when the control circuit 4 applies the first ON-voltage or more to the gate of the MOSFET M2 under this condition, the current Idl flowing between the drain and source of the MOSFET M2 is increased transiently. During the reverse recovery action of the body diode D1, the current continues to flow in a forward direction of the external diode D3 through the second current path due to the effect of the inductor L1.

Then, as shown in the period (5C) in FIG. 6A, when the current flows in a reverse direction through the second current path, the reverse recovery current flowing to the first current path becomes almost zero. Thus, the amount of overshoot of the current is reduced. As indicated by a chain double-dashed line in the period (5C) in FIG. 6A, if the control circuit 4 does not apply the control voltage Va to the gate of the MOSFET M1 before applying the first ON-voltage or more to the gate of the MOSFET M2, the amount of overshoot of the current is increased, and a time period required until the current becomes stable is increased. As mentioned previously, this is because the reverse recovery current of the body diode D1 is increased in the period (5C) in FIG. 6A.

FIG. 7 illustrates a result of a simulation conducted by the present inventors to measure a change in the current Idl with a change in the control voltage Va applied to the gate of the MOSFET M1. The simulation result illustrated in FIG. 7 shows that the amount of overshoot of the current and the time period required until the current becomes stable can be reduced by increasing the control voltage Va as much as possible. It is noted that the control voltage Va needs to be less than the threshold voltage Vth of the MOSFET M1.

The control circuit 4 can cause the gate voltage of the MOSFET M1 to be the turn-OFF voltage (e.g., 0 volts) when the load current increases from zero to a target value for the inductive load 3. In the example shown in FIG. 6A, the control circuit 4 causes the gate voltage of the MOSFET M1 to be the turn-OFF voltage (e.g., 0 volts) after applying the control voltage Va to the gate of the MOSFET M1. Alternatively, as shown in FIG. 6B, the control voltage Va can be continuously applied to the gate of the MOSFET M1 over the periods (5C), (5D) in FIG. 6B. To reduce unwanted external voltages such as noise and surge, it is preferable that the gate voltage of the MOSFET M1 be caused to be zero when the load current reaches the target value, as shown in FIG. 6A. Although the reverse recovery characteristics of the body diode D1 change depending on parameters such as structures of the MOSFETs M1, M2, the magnitude of the control voltage Va and a period during which the control voltage Va is kept applied can be determined by conducting a simulation and an experiment.

Figure 8A:
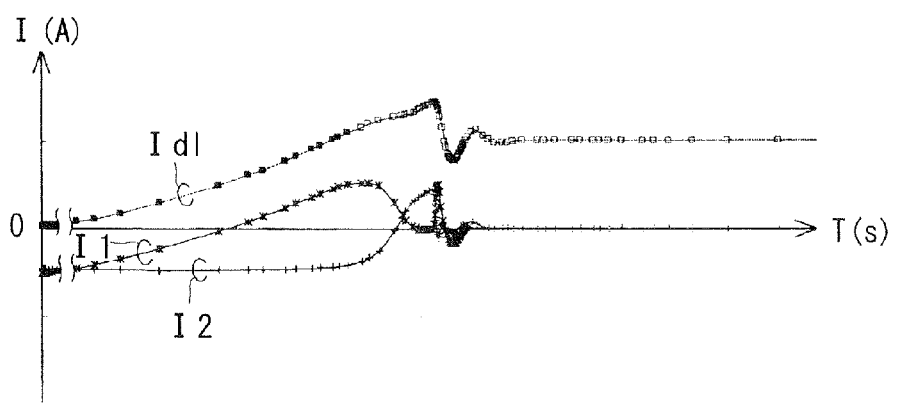
FIG. 8A is a diagram illustrating a result of a first simulation conducted to evaluate characteristic of currents in the drive controller.
Figure 8B:
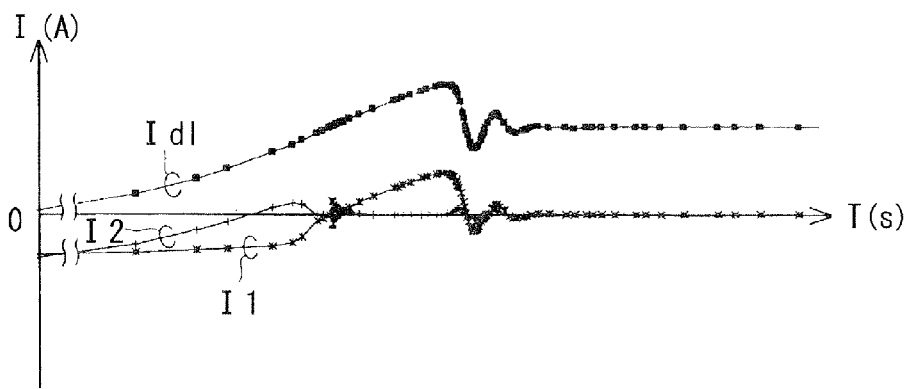
FIG. 8B is a diagram illustrating a result of a second simulation conducted to evaluate the characteristics of the currents in the drive controller.
Figure 9A:
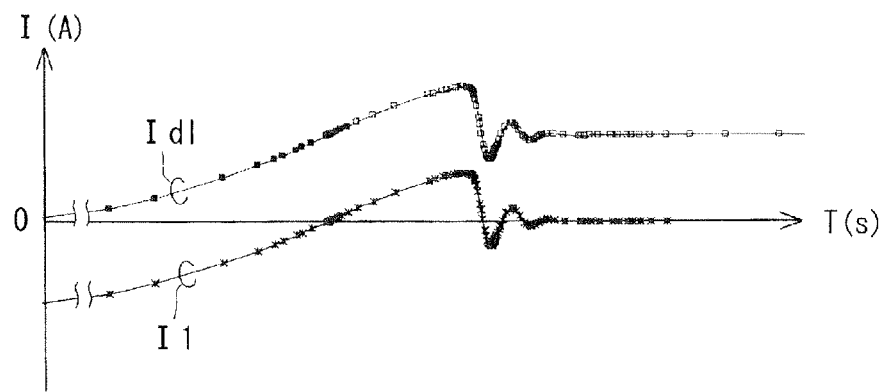
FIG. 9A is a diagram illustrating a result of a third simulation conducted to evaluate the characteristics of the currents in the drive controller.
Figure 9B:
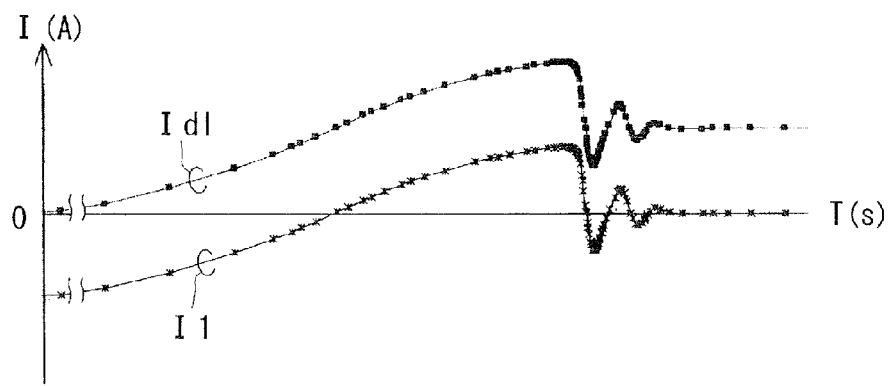
FIG. 9B is a diagram illustrating a result of a fourth simulation conducted to evaluate the characteristics of the currents in the drive controller.

FIGS. 8A, 8B and 9A, 9B show results of simulations conducted by the present inventors. FIG. 8A shows the result of the simulation in which the currents I1, I2, Idl are measured by applying the control voltage Va to the gate of the MOSFET M1 using a circuit configuration shown in FIG. 1. FIG. 8B shows the result of the simulation in which the currents I1, I2, Idl are measured by applying the control voltage Va to the gate of the MOSFET M1 using the circuit configuration from which the inductor L1 is removed. FIG. 9A shows the result of the simulation in which the currents I1, Idl are measured by applying the control voltage Va to the gate of the MOSFET M1 using the circuit configuration from which the series circuit of the external diode D3 and the inductor L1 is removed. FIG. 9B shows the result of the simulation in which the currents I1, Idl are measured by applying no control voltage Va to the gate of the MOSFET M1 using the circuit configuration from which the series circuit of the external diode D3 and the inductor L1 is removed.

The reverse current I1 of the body diode D1 decreases in the following orders: FIG. 9B, FIG. 9A, FIG. 8B, and FIG. 8A. That is, the simulation results show that the reverse recovery current can be reduced by applying the control voltage Va to the gate of the MOSFET M1. Further, the simulation results show that the reverse recovery current can be much reduced by connecting the series circuit of the external diode D3 and the inductor L1 in parallel with the body diode D1.

As described above, according to the first embodiment, the series circuit of the external diode D3 and the inductor L1 is connected in parallel with the body diode D1. In such an approach, when the load current circulates, it is likely that the load current continues to flow in the forward direction of the external diode D3 due to the effect of the inductor L1.

Further, according to the first embodiment, the control circuit 4 applies the control voltage Va to the gate of the MOSFET M1 before applying the first ON-voltage or more to the gate of the MOSFET M2. The control voltage Va is greater than zero and less than the threshold voltage Vth of the MOSFET M1, i.e., the "second ON-voltage". Thus, when the current continues to flow through the inductor L1 and the external diode D3, the reverse recovery current flows through the body diode D1. Therefore, the flow of the reverse recovery current of the body diode D1 to the MOSFET M2 can be reduced.

Preferably, the control voltage Va should have a margin that can prevent the control voltage Va from exceeding the threshold voltage Vth of the MOSFET M1 when noise is superimposed on the control voltage Va. In such an approach, a self turn-ON of the MOSFET M1 due to noise can be prevented.

When the inductor L1 is a bonding wire, a desired inductance can be easily obtained. When the MOSFETs M1, M2 are super junction MOSFETs, switching loss is large. In such a case, the first embodiment can be applied to effectively reduce the switching loss.

Modification of the First Embodiment

Figure 10:
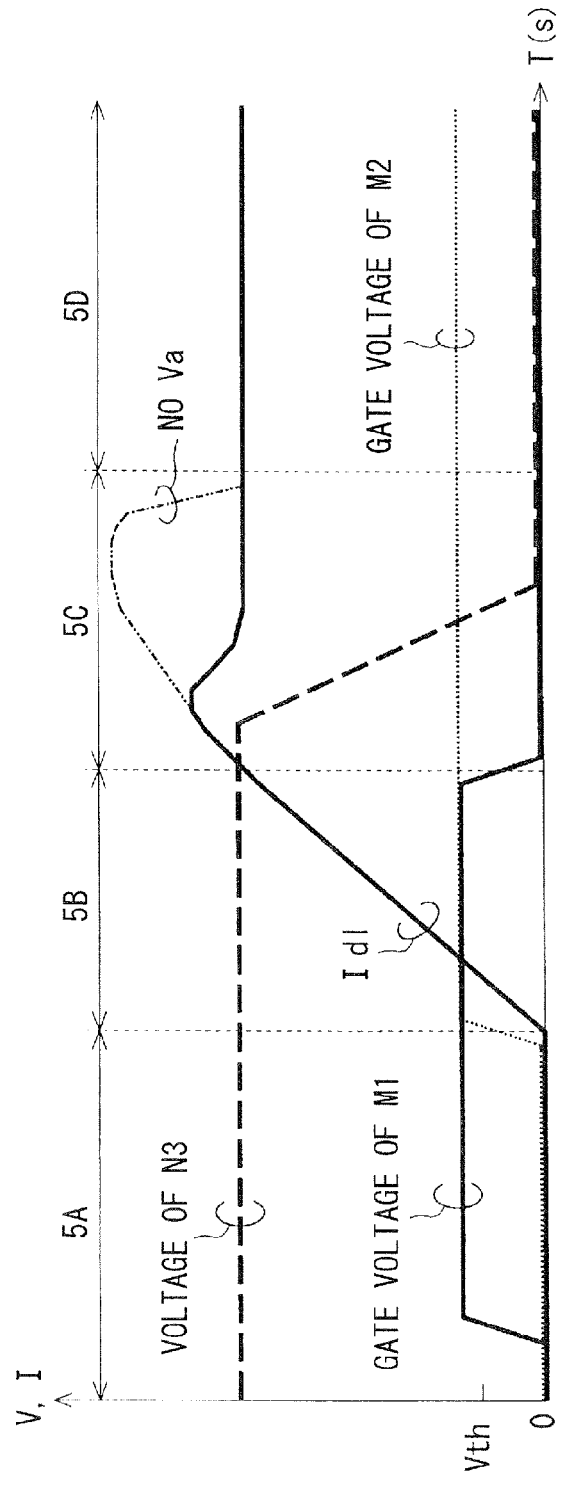
FIG. 10 is a diagram corresponding to FIG. 6A and illustrating voltage-current characteristics of a drive controller according to a modification of the first embodiment.
Figure 11A:
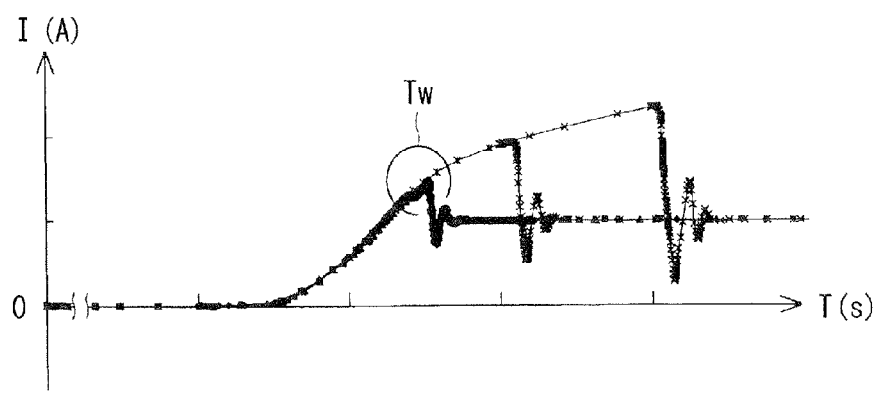
FIG. 11A is a diagram illustrating a result of a first simulation conducted to evaluate characteristic of a current in the drive controller according to the modification.
Figure 11B:
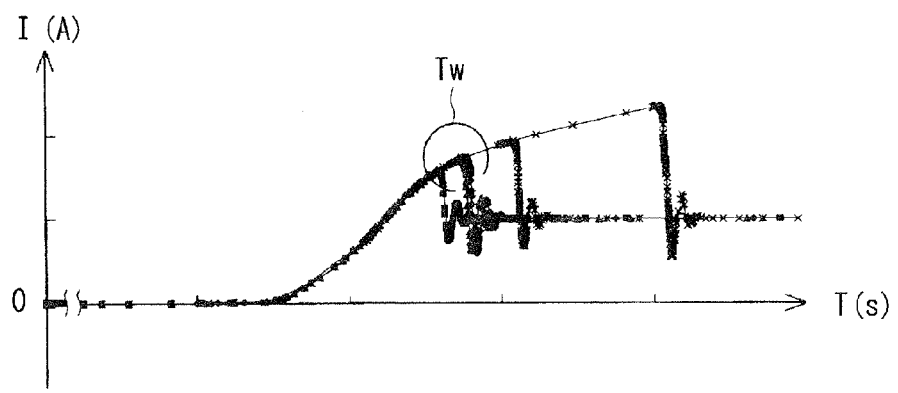
FIG. 11B is a diagram illustrating a result of a second simulation conducted to evaluate the characteristic of the current in the drive controller according to the modification.

A modification of the first embodiment is described below with reference to FIGS. 10 and 11A, 11B. FIG. 10 is a timing chart obtained when the second ON-voltage or more is applied to the gate of the MOSFET M1 before the first ON-voltage or more is applied to the gate of the MOSFET M2, and then the application of the second ON-voltage or more to the gate of the MOSFET M1 is removed at a predetermined time so that the gate voltage of the MOSFET M1 can be the turn-OFF voltage (e.g., 0 volts). FIGS. 11A and 11B show result of simulations conducted by the present inventors.

FIG. 11A shows the result of the simulation in which the current Idl is measured by applying the second ON-voltage or more to the gate of the MOSFET M1 using a circuit configuration shown in FIG. 1 and then the application of the second ON-voltage or more to the gate of the MOSFET M1 is removed at the predetermined time so that the gate voltage of the MOSFET M1 can be the turn-OFF voltage (e.g., 0 volts). FIG. 11B shows the result of the simulation in which the current Idl is measured by keeping the gate voltage of the MOSFET M1 at the turn-OFF voltage (e.g., 0 volts). It is noted that the same characteristics as shown in FIG. 11B can be obtained in a typical half-bridge circuit having no external diode D3 and no inductor L1.

Specifically, FIGS. 11A and 11B illustrate characteristics of the current Idl flowing to the MOSFET M2 observed when the time at which the application of the second ON-voltage or more to the gate of the MOSFET M1 is removed is changed in five stages. As can be seen from FIGS. 11A and 11B, when the control circuit 4 instantaneously applies the second ON-voltage or more to the gate of the MOSFET M1, the current I1 gradually increases. Then, when the diode reverse recovery action is ended, the current I1 decreases sharply and converges to the target value.

In particular, as shown in FIG. 11A, if the application of the second ON-voltage or more to the gate of the MOSFET M1 is removed at a time that is within a predetermined time range Tw after the application of the second ON-voltage or more to the gate of the MOSFET M1, the current Idl decreases sharply toward the target value at almost the same time. Thus, even when the time at which the application of the second ON-voltage or more to the gate of the MOSFET M1 is removed is shifted a little, almost the same characteristic of the current Idl can be obtained.

That is, as long as the time at which the application of the second ON-voltage or more to the gate of the MOSFET M1 is removed is within the time range Tw, a variation in the maximum value of the current Idl can be reduced. Therefore, as can be seen by comparing FIGS. 11A and 11B, a margin for the time at which the application of the second ON-voltage or more to the gate of the MOSFET M1 is removed can be increased. Thus, the reverse recovery current can be reduced without exactly adjusting the time at which the application of the second ON-voltage or more to the gate of the MOSFET M1 is removed.

Package Structure for the First Embodiment

Figures 12A, 12B, 12C, 12D:
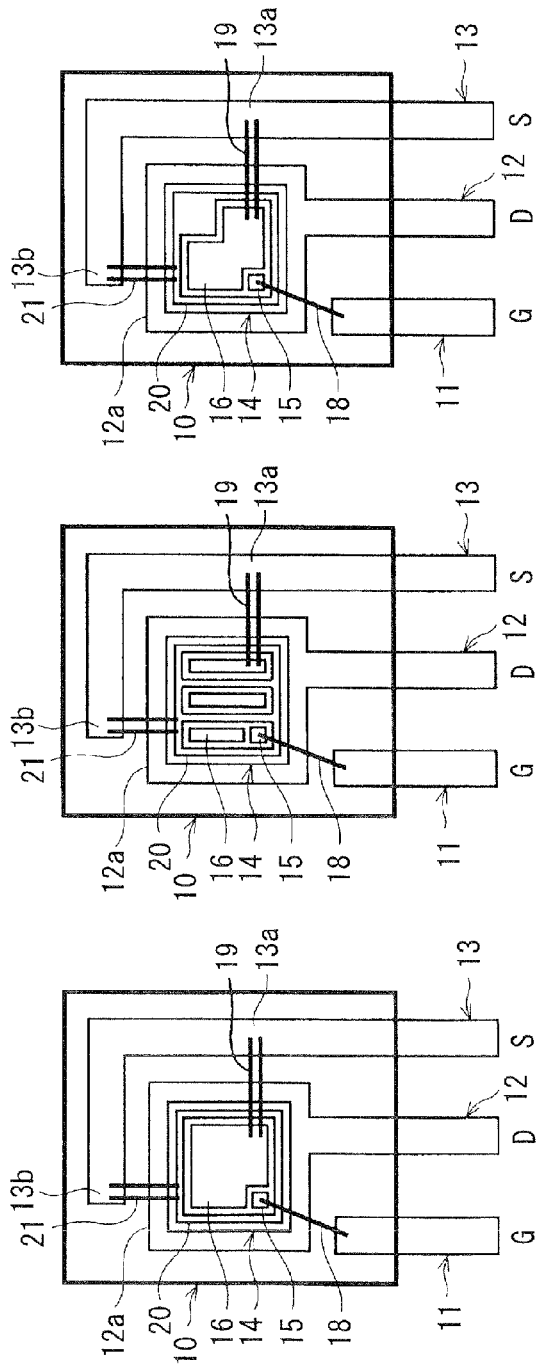
FIGS. 12A-12C are diagrams illustrating a top view of a package for the drive controller and FIG. 12D is a diagram illustrating an electrical connection in the package.

FIGS. 12A-12C illustrate examples of a package 10 for the MOSFET M1, the body diode D1, the external diode D3, and the inductor L1 that are connected as shown in FIG. 12D. FIG. 12A is a top view of the first example of the package 10, FIG. 12B is a top view of the second example of the package 10, and FIG. 12C is a top view of the third example of the package 10.

As shown in FIGS. 12A-12C, three lead terminals 11-13 as electrical conductors are inserted into the package 10. The lead terminal 11 serves as a gate (G) of the MOSFET M1, the lead terminal 12 serves as a drain (D) of the MOSFET M1, and the lead terminal 13 serves as a source (S) of the MOSFET M1.

A first end 12a of the lead terminal 12 is located inside the package 10 and shaped like a rectangular plate. A semiconductor chip 14 is mounted on the first end 12a of the lead terminal 12. A gate electrode 15 and a source electrode 16 are formed on a front surface of the semiconductor chip 14 and separated from each other. Further, a drain electrode 17 (see, FIGS. 14A and 14B) of the MOSFET M1 is formed on a back surface of the semiconductor chip 14. It is noted that the drain electrode 17 also serves as a cathode electrode of the external diode D3.

The gate electrode 15 of the semiconductor chip 14 is connected to the lead terminal 11 by a bonding wire 18. The source electrode 16 of the semiconductor chip 14 is connected to a first portion 13a of the lead terminal 13 by a bonding wire 19.

As shown in FIGS. 12A-12C, an anode electrode 20 of the external diode D3 is formed around a front surface of the source electrode 16. The anode electrode 20 of the external diode D3 is connected to a second portion 13b of the lead terminal 13 by a bonding wire 21. The bonding wires 19, 21 and a portion between the first portion 13a and the second portion 13b of the bonding wire 21 form the inductor L1. For example, the lead terminal 13 can be L-shaped and partially surround the rectangular first end 12a of the lead terminal 12.

For example, the inductance of the inductor L1 can be about 1[nH/mm]. In the examples shown in FIGS. 12A-12C, the inductor L1 is formed with the lead terminal 13 and the bonding wires 19, 21. Alternatively, the inductor L1 can be formed with only the lead terminal 13. Alternatively, the inductor L1 can be formed with only the bonding wire 19 or the bonding wire 21. In this case, the inductor L1 can be adjusted to a necessary value by adjusting the length of the lead terminal 13, the bonding wire 19, or the bonding wire 21 by several centimeters or less.

FIGS. 13A-13C are partially enlarged views of FIGS. 12A-12C, respectively. As shown in FIG. 13A, the anode electrode 20 of the external diode D3 can be formed around a single source electrode 16. Alternatively, as shown in FIG. 13B, the source electrode 16 can be divided into multiple sections, and the anode electrode 20 can be formed around each section of the source electrode 16. Alternatively, as shown in FIG. 13C, the source electrode 16 and the anode electrode 20 can be positioned with respect to each other so that facing area between the anode electrode 20 and the cathode electrode of the external diode D3 can be increased.

Figure 14A:
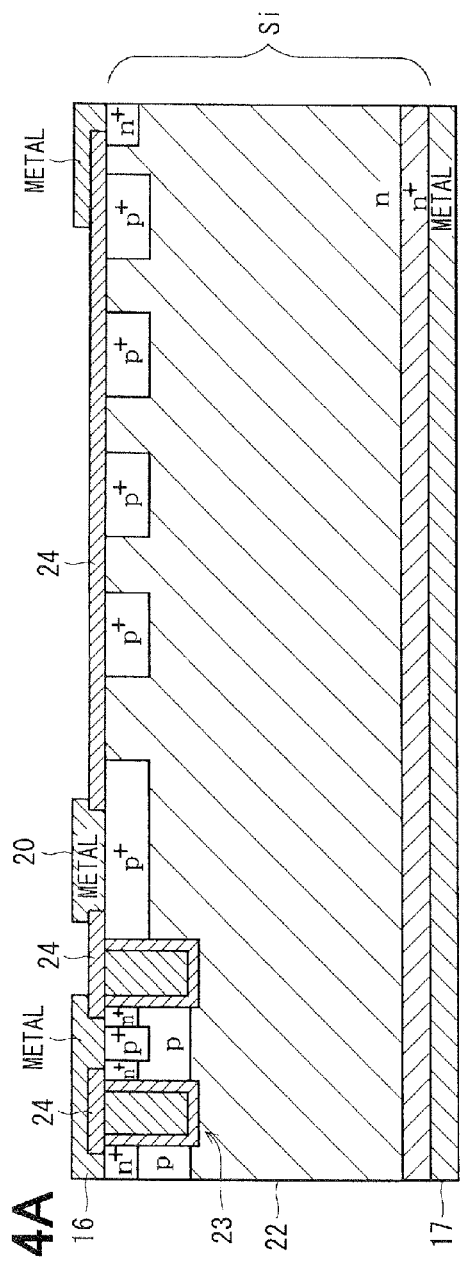
FIG. 14A is a diagram illustrating a cross-sectional view taken along the line XVIA-XVIA in FIGS. 13A-13C.

FIG. 14A is a cross-sectional view taken along the line XIVA-XIVA in FIGS. 13A-13C, and FIG. 14B is a cross-sectional view taken along the line XIVB-XIVB in FIGS. 13A-13C. The line XIVA-XIVA passes a gate structure, but the line XIVB-XIVB does not pass the gate structure.

For example, a substrate 22 can be an n-type silicon substrate having an $n^+$-type layer defining a back surface of the substrate 22. The drain electrode 17 is formed on the $n^+$-type layer. Multiple $p^+$-type layers are formed in a front surface of the substrate 22. The $p^+$-type layers are arranged inwardly from an outer edge of the front surface of the substrate 22 and separated from each other. The anode electrode 20 is formed on one of the p$^+$-type layers. The p$^+$-type layer on which the anode electrode 20 is formed is not the outermost p$^+$-type layer.

As shown in FIG. 14A, in the substrate 22, a vertical MOSFET structure (n$^+$-type layer, p-type layer, and n-type layer) of the MOSFET M1 is formed below the anode electrode 20, and a P-N junction diode as the body diode D1 is formed. A trench gate 23 is formed in the front surface of the substrate and connected to the gate electrode 15.

Figure 14B:
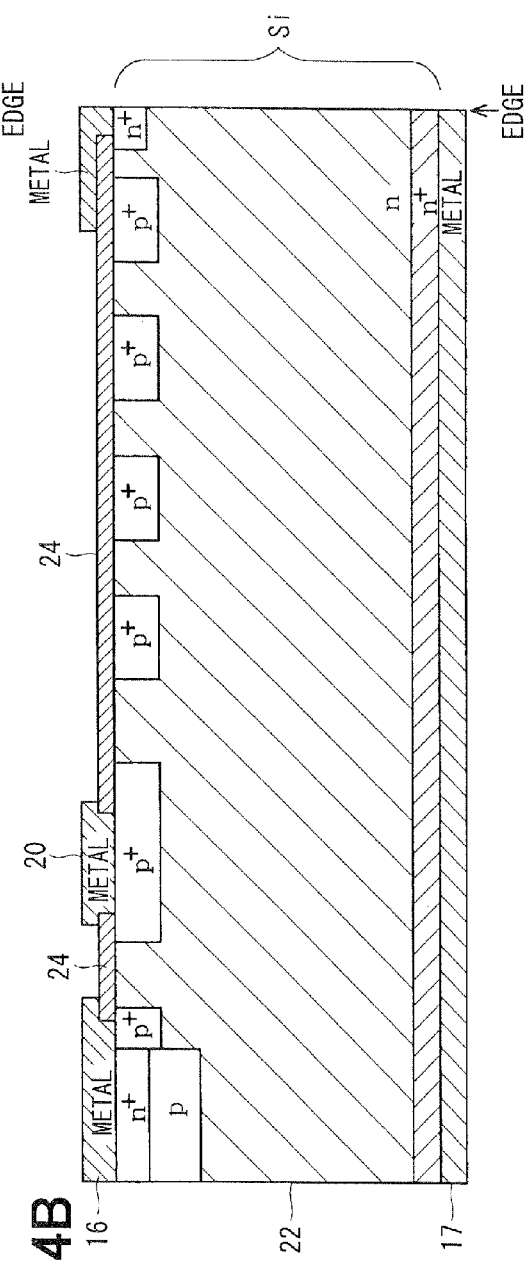
FIG. 14B is a diagram illustrating a cross-sectional view taken along the line XVIB-XVIB in FIGS. 13A-13C.

As shown in FIG. 14B, a p$^+$-type layer and a n$^+$-type layer are formed in the front surface of the substrate 22, and the source electrode 16 is formed on the p$^+$-type layer and the n$^+$-type layer. A p-type layer is formed under the n$^+$-type layer on which the source electrode 16 is formed. An insulation layer 24 such as a SiO$_2$ layer is formed on the front surface of the substrate 22 in such a manner that the gate electrode 15, the source electrode 16, and the anode electrode 20 are in contact with the substrate 22.

Thus, a vertical MOSFET structure including the MOSFET M1 and the body diode D1 is formed between the gate electrode 15 and the drain electrode 17, and the external diode D3 is formed between the anode electrode 20 and the cathode electrode 17. In this way, the MOSFET M1, the body diode D1, the external diode D3, and the inductor L1 are implemented on a single semiconductor chip 14.

Second Embodiment

A drive controller 1 according to a second embodiment of the present invention is described below with reference to FIGS. 15 and 16A-16C. A difference between the first embodiment and the second embodiment is as follows.

The second embodiment is similar to the modification of the first embodiment. According to the modification of the first embodiment, the control circuit 4 turns OFF the MOSFET M1 at the predetermined time by applying a voltage less than the second ON-voltage to the gate of the MOSFET M1 after applying the second ON-voltage or more to the gate of the MOSFET M1. The second embodiment defines the predetermined time at which the control circuit 4 turns OFF the MOSFET M1.

Figure 15:
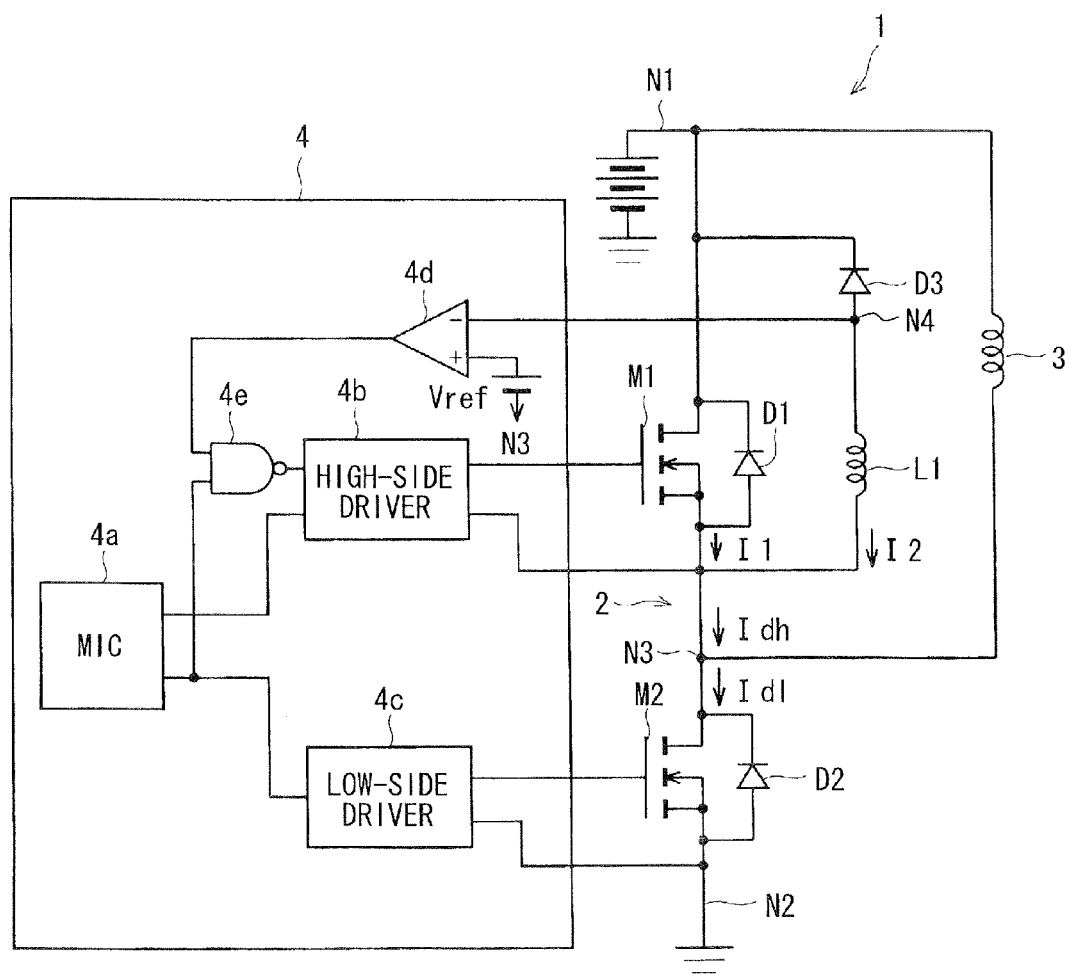
FIG. 15 is a circuit diagram of a drive controller according to a second embodiment of the present invention.

As shown in FIG. 15, according to the second embodiment, the control circuit 4 includes a microcomputer (MIC) 4a, a high-side driver 4b, a low-side driver 4c, a comparator 4d, and an NAND gate 4e. The microcomputer 4a sends a control signal to the high-side driver 4b. In response to the control signal, the high-side driver 4b applies a control voltage between the gate and the source of the MOSFET M1. Likewise, the microcomputer 4a sends a control signal to the low-side driver 4c. In response to the control signal, the low-side driver 4c applies a control voltage between the gate and the source of the MOSFET M2.

Thus, in the control circuit 4, the microcomputer 4a drives and controls the MOSFETs M1, M2 by using the high-side driver 4b and the low-side driver 4c, respectively. An inverting input terminal of the comparator 4d is connected to a node N4 between the anode of the external diode D3 and the inductor L1. A reference voltage Vref is supplied to a non-inverting input terminal of the comparator 4d. The reference voltage Vref is based on the potential at the node N3.

An output of the comparator 4d is supplied to a first input terminal of the NAND gate 4e. The control signal supplied to the low-side driver 4c is supplied to a second input of the NAND gate 4e. An output of the NAND gate 4e is supplied to the high-side driver 4b. The high-side driver 4b applies the control voltage between the gate and the source of the MOSFET M1 based on the output of the NAND gate 4e. Thus, the high-side driver 4b applies the control voltage between the gate and the source of the MOSFET M1 based on an induced electromotive force (IEF) in the inductor L1 and the control signal supplied to the low-side driver 4c.

FIGS. 16A-16C are timing chart obtained when the second ON-voltage or more is applied to the gate of the MOSFET M1 before the first ON-voltage or more is applied to the gate of the MOSFET M2, and then the application of the second ON-voltage or more to the gate of the MOSFET M1 is removed at a predetermined time so that the gate voltage of the MOSFET M1 can be the turn-OFF voltage (e.g., 0 volts).

FIG. 16A corresponds to FIG. 10. FIG. 16B illustrates a time response of the energizing current I1 of the body diode D1 and a time response of the energizing current I2 of the external diode D3. In FIG. 16B, the energizing current I1 in the forward direction of the body diode D1 is negative. FIG. 16C illustrates a time response of the induced electromotive force generated in the inductor L1.

As can be seen from FIGS. 16A and 16B, the control circuit 4 applies the second ON-voltage or more to the gate of the MOSFET M1 at a time T1 prior to a time T2 at which the control circuit 4 applies the first ON-voltage or more to the gate of the MOSFET M2.

In this case, before the time T1, the current having a predetermined value flows in the forward direction of each of the body diode D1 and the external diode D3. Then, when the control circuit 4 applies the second ON-voltage or more to the gate of the MOSFET M1 at the time T1, the forward current of the body diode D1 gradually decreases (i.e., the current I1 gradually increases), but the forward current of the external diode D3 gradually increases (i.e., the current I2 gradually decreases). Thus, during a time period from the time T2 to the time T3, the induced electromotive force is generated in the inductor L1 based on −Ldi/dt so that an increase in the current of the external diode D3 can be prevented.

Then, at the time T2, when the time rate of change in the current of each of the body diode D1 and the external diode D3 becomes zero so that the induced electromotive force can be almost zero, the control circuit 4 applies the first ON-voltage or more to the gate of the MOSFET M2. As a result, the reverse recovery current of the body diode D1 significantly changes. However, the forward current of the external diode D3 does not significantly change due to the induced electromotive force in the inductor L1.

In this case, the reverse recovery current flows through the external diode D1, as long as the current continues to flow through the inductor L1 and the external diode D3. Then, when the early half of the recovery period of the body diode D1 is elapsed, and the later half of the recovery period of the body diode D1 is started, the forward current of the body diode D1 sharply decreases (i.e., the current I1 sharply increases). As a result, the forward current of the external diode D3 sharply increases (i.e., the current I1 sharply decreases) so that the induced electromotive force in the inductor L1 can change sharply based on −Ldi/dt.

The comparator 4d compares the induced voltage in the inductor L1 with the reference voltage Vref. When the induced voltage becomes equal to or greater than the reference voltage Vref, the comparator 4d outputs a turn-OFF command to the NAND gate 4e. In response to the turn-OFF command, the NAND gate 4e outputs a turn-OFF signal to the high-side driver 4b on the condition that the control signal outputted from the microcomputer 4a to the low-side driver 4c is a turn-ON signal. In response to the turn-OFF signal, the high-side driver 4b applies a turn-OFF voltage (e.g., 0 volts) to the gate of the MOSFET M1 (at a transition from the period (5B) to the period (5C) in FIG. 16A). Thus, the control circuit 4 can surely turn OFF the MOSFET M1 at the predetermined time after applying the second ON-voltage or more to the gate of the MOSFET M1.

As described above, according to the second embodiment, the control circuit 4 applies the turn OFF voltage to the gate of the MOSFET M1 at the predetermined time after applying the second ON-voltage or more to the gate of the MOSFET M1. In such an approach, it is possible to prevent the second ON-voltage or more from being applied to the gate of the MOSFET M1 continuously for a long time. Thus, reliability can be improved.

Further, the induced voltage in the inductor L1 is detected to determine whether the current in the external diode D3 increases above a predetermined value, and the MOSFET M1 is turned OFF at the predetermined time after the time at which the current in the external diode D3 increases above the predetermined value. In such an approach, the voltage between the gate and the source of the MOSFET M1 can be made to the turn-OFF voltage (e.g., 0 volts) according to the change in the induced voltage in the inductor L1.

Further, only when the control signal supplied from the microcomputer 4a to the low-side driver 4c is the turn-ON signal, the output of the comparator 4d is enabled so that the turn-OFF signal can be supplied to the high-side driver 4b. A reason for this is that there is need to supply the turn-OFF signal to the high-side driver 4b during a time period when the control signal supplied from the microcomputer 4a to the low-side driver 4c is the turn-OFF signal. In such an approach, it is possible to prevent the turn-OFF signal from being supplied to the high-side driver 4b according to the induced voltage in the inductor L1 during the time period when the control signal supplied from the microcomputer 4a to the low-side driver 4c is the turn-OFF signal. Thus, malfunction is prevented so that reliability can be improved.

Modification of the Second Embodiment

Figure 17:
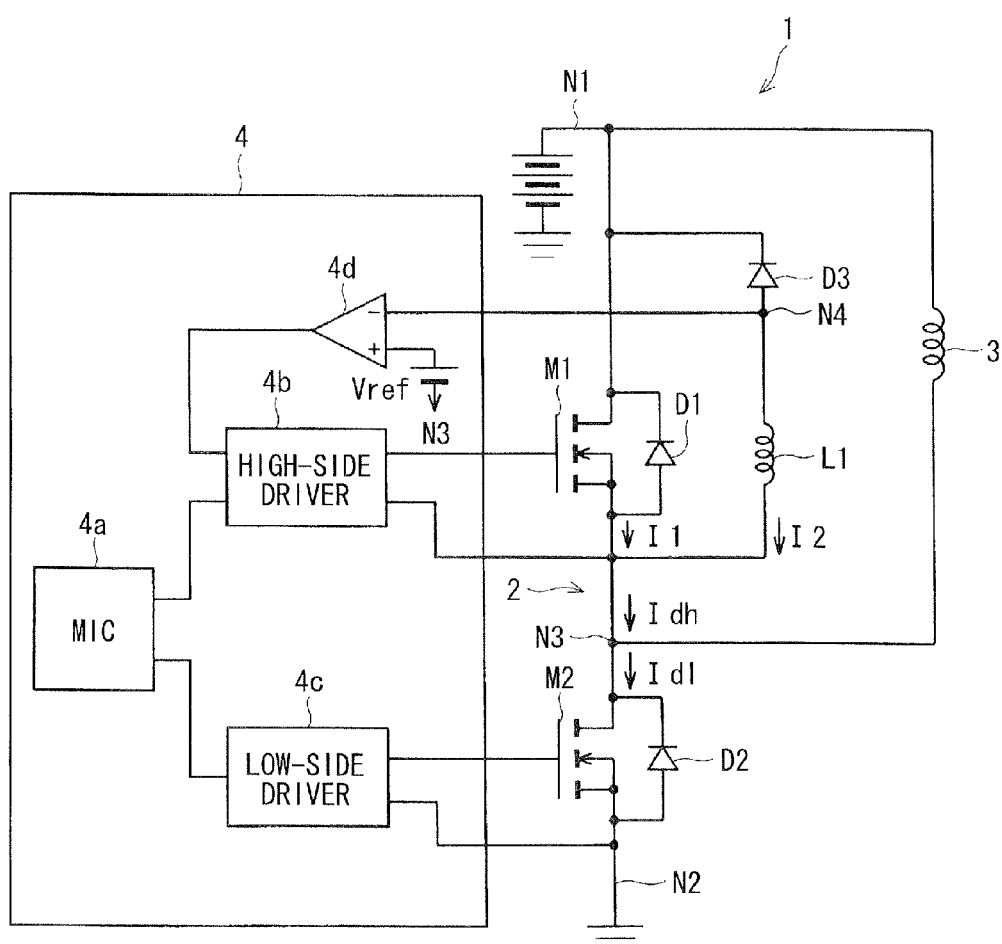
FIG. 17 is a circuit diagram of a drive controller according to a modification of the second embodiment.

A drive controller 1 according to a modification of the second embodiment of the present invention is described below with reference to FIG. 17. As shown in FIG. 17, according to the modification of the second embodiment, the NAND gate 4e is removed so that the output of the comparator 4d can be supplied directly to the high-side driver 4b. Further, the high-side driver 4b generates the control signal to the MOSFET M1 without using the control signal that is supplied from the microcomputer 4a to the low-side driver 4c. When receiving the turn-OFF signal form the comparator 4d, the high-side driver 4b applies the turn-OFF voltage to the gate of the MOSFET M1. Thus, responsivity can be improved.

According to the second embodiment, there may be a need to place a level-shift circuit between the NAND gate 4e, the microcomputer 4a, the comparator 4d, and the high-side driver 4b. In contrast, according to the modification of the second embodiment, such a level-shift circuit is not needed so that the drive controller 1 can be simplified.

Package Structure for the Second Embodiment

FIGS. 18A-18C illustrate examples of a package 10 for the second embodiment and the modification of the second embodiment. FIG. 18A is a top view of the first example of the package 10, FIG. 18B is a top view of the second example of the package 10, and FIG. 18C is a top view of the third example of the package 10. As shown in FIGS. 18A-18C, four lead terminals 11-13, and 25 as electrical conductors are inserted into the package 10. The lead terminal 11 serves as a gate (G) of the MOSFET M1, the lead terminal 12 serves as a drain (D) of the MOSFET M1, and the lead terminal 13 serves as a potential sensing terminal (Se), and the lead terminal 25 serves as a source (S) of the MOSFET M1.

The lead terminal 13 is configured to detect a potential at a node between the external diode D3 and the inductor L1 and connected to the inverting input terminal of the comparator 4d. The first portion 13a of the lead terminal 13 is connected to the lead terminal 25 by a bonding wire 19a. The lead terminal 25 is connected to the source electrode 16 by a bonding wire 19b.

In the examples shown in FIGS. 18A-18C, the potential is detected at the first portion 13a. Alternatively, the potential can be detected at the second portion 13b. Alternatively, the potential can be detected at the portion between the first portion 13a and the second portion 13b. Since the lead terminal 25 is electrically connected to the inverting input terminal of the comparator 4d, the induced voltage in the inductor L1 can be detected and compared with the reference voltage Vref.

Modifications

The embodiment described above can be modified in various ways, for example, as follows.

In the embodiments, the forward voltage Vf of the body diode D1 is less than the forward voltage Vf of the external diode D3 before the application of the gate voltage. Alternatively, the forward voltage Vf of the body diode D1 can be greater than the forward voltage Vf of the external diode D3 before the application of the gate voltage.

In the embodiments, the inductor L1 is formed with the bonding wire. Alternatively, the inductor L1 can be formed with another member having an inductance component. For example, the other member can be integrated in the semiconductor chip 14.

The MOSFETs M1, M2 can be other types of switching devices having a body diode, such as a RC-IGBT.

In the embodiments, the MOSFETs M1, M2 have a trench-gate structure. Alternatively, the switching device can have a planar gate structure. The external diode D3 can be a gate-controlled diode (i.e., MOS control diode).

In the modification of the first embodiment shown in FIG. 10, the voltages applied to the gates of the MOSFETS M1, M2 have the same value. Alternatively, the voltages applied to the gates of the MOSFETS M1, M2 can have different values. Further, the MOSFETs M1, M2 can have different threshold voltages Vth.

In the embodiments, the external diode D3 is a PN junction diode. Alternatively, the external diode D3 can be a Schottky barrier diode.

Such changes and modifications are to be understood as being within the scope of the present invention as defined by the appended claims.

What is claimed is:

1. A drive controller for driving an inductive load connected to a node between a first switching device and a second switching device that are connected in series with a direct current voltage source, the drive controller comprising:
a first diode connected in antiparallel with the first switching device, the first diode configured as a parasitic diode of the first switching device;
a series circuit including a second diode and an inductor, the series circuit connected in parallel with the first diode; and
a control circuit in communication with both the first switching device and the second switching device and configured to selectively apply a first ON-voltage to the second switching device, a second ON-voltage to the first switching device, and a control voltage to the first switching device, the control circuit being further configured to drive the inductive load by applying the first ON-voltage to a control terminal of the second switching device after applying the control voltage to a control terminal of the first switching device, wherein the first ON-voltage turns ON the second switching device, the control voltage is greater than zero and less than the second ON-voltage by a first value, the second ON-voltage turns ON the first switching device, and the control voltage causes the first switching device to operate in weak inversion, wherein the control circuit is further configured to apply the control voltage to the control terminal of the first switching device before it applies the first ON-voltage to the second switching device, and then continues to apply the control voltage to the control terminal of the first switching device and the first ON-voltage to the second switching device for an overlapping period of time.

2. The drive controller according to claim 1, wherein the control voltage is less than the second ON-voltage by a second value greater than the first value.

3. The drive controller according to claim 1, wherein the inductor includes a bonding wire.

4. The drive controller according to claim 1, wherein the inductor includes both a bonding wire and a lead terminal.

5. The drive controller according to claim 1, wherein when an electric current flowing through the second switching device reaches a target value for a load current of the inductive load, the control circuit reduces the control voltage below a predetermined threshold voltage.

6. The drive controller according to claim 1, wherein the control circuit applies an OFF voltage to the control terminal of the first switching device at a timing depending on an induced voltage in the inductor, after applying the control voltage to the control terminal of the first switching device, and the OFF voltage turns OFF the first switching device.

7. The drive controller according to claim 1, wherein the control circuit includes a determination circuit configured to determine whether an induced voltage in the inductor is equal to or greater than a predetermined reference voltage, and the control circuit applies an OFF voltage to the control terminal of the first switching device on a condition that the induced voltage is equal to or greater than the predetermined reference voltage, after applying the control voltage to the control terminal of the first switching device, and the OFF voltage turns OFF the first switching device.

8. The drive controller according to claim 7, wherein the determination circuit determines whether the induced voltage in the inductor is equal to or greater than the predetermined reference voltage based on a first potential at a node between the inductor and the second diode or based on a second potential at a predetermined point on the inductor.

9. The drive controller according to claim 1, wherein the control circuit includes a first determination circuit and a second determination circuit, the first determination circuit determines whether an induced voltage in the inductor is equal to or greater than a predetermined reference voltage, the second determination circuit determines whether the first ON-voltage is applied to the control terminal of the second switching device, and the control circuit applies an OFF voltage to the control terminal of the first switching device on conditions that the induced voltage is equal to or greater than the predetermined reference voltage and that the first ON-voltage is applied to the control terminal of the second switching device, after applying the second-ON voltage to the control terminal of the first switching device, and the OFF voltage turns OFF the first switching device.

10. The drive controller according to claim 1, wherein the first switching device, the first diode, the second diode, and the inductor are implemented on a single semiconductor chip.

11. The drive controller according to claim 1, wherein the second diode is a PN junction diode or a Schottky barrier diode.

12. The drive controller according to claim 1, wherein the second diode is a gate-controlled diode.

13. The drive controller according to claim 1, wherein the control circuit continues the application of the control voltage to the control terminal of the first switching device until after the application of the first ON-voltage to the control terminal of the second switching device.

14. The drive controller according to claim 1, wherein the first switching device is connected in parallel to the load.

15. The drive controller according to claim 1, wherein the control circuit is configured to apply the control voltage to the control terminal of the first switching device to limit a flow of reverse recovery current from the first diode to the second switching device.

16. The drive controller according to claim 15, wherein the control voltage causes current to flow through the series circuit in parallel with the first diode, to limit the flow of the reverse recovery current to the second switching device.

17. The drive controller according to claim 1, wherein the first switching device comprises a diode-side switching device and the second switching device comprises a switching-side switching device.

18. The drive controller according to claim 1, wherein the control circuit is further configured to cause a gate voltage of the first switching device to be zero when a load current of the inductive load reaches a target value.

19. A drive controller for driving an inductive load connected to a node between a first switching device and a second switching device that are connected in series with a direct current voltage source, the drive controller comprising:

a first diode connected in antiparallel with the first switching device, the first diode configured as a parasitic diode of the first switching device;

a series circuit including a second diode and a inductor, the series circuit connected in parallel with the first diode; and a control circuit in communication with both the first switching device and the second switching device and configured to selectively apply a first ON-voltage to the second switching device, a second ON-voltage to the first switching device, and a control voltage to the first switching device, the control circuit being further configured to drive the inductive load by applying the first ON-voltage to a control terminal of the second switching device after applying the control voltage to a control terminal of the first switching device, wherein the first ON-voltage turns ON the second switching device, the control voltage is equal to or greater than the second ON-voltage, the second ON-voltage turns ON the first switching device, and the control circuit stops the application of the control voltage at a predetermined time within a predetermined time range after the application of the control voltage, wherein the control circuit is further configured to apply the control voltage to the control terminal of the first switching device before it applies the first ON-voltage to the second switching device, and then stops the application of the control voltage at the predetermined time within the predetermined time range after the application of the first ON-voltage.

20. The drive controller according to claim 19, wherein the control circuit continues the application of the control voltage to the control terminal of the first switching device until after the application of the first ON-voltage to the control terminal of the second switching device.

21. The drive controller according to claim 19, wherein the first switching device is connected in parallel to the load.

22. The drive controller according to claim 19, wherein the control circuit is configured to apply the control voltage to the control terminal of the first switching device to limit a flow of reverse recovery current from the first diode to the second switching device.

23. The drive controller according to claim 22, wherein the control voltage causes current to flow through the series circuit in parallel with the first diode, to limit the flow of the reverse recovery current to the second switching device.

24. The drive controller according to claim 19, wherein the first switching device comprises a diode-side switching device and the second switching device comprises a switching-side switching device.

25. The drive controller according to claim 19, wherein
the control circuit is further configured to cause a gate voltage of the first switching device to be zero when a load current of the inductive load reaches a target value.

* * * * *